United States Patent
Li et al.

(10) Patent No.: US 9,496,824 B2
(45) Date of Patent: Nov. 15, 2016

(54) OSCILLATOR CIRCUIT

(71) Applicant: Infineon Technologies AG, Neubiberg (DE)

(72) Inventors: Hao Li, Poing (DE); Jidan Al-Eryani, Deisenhofen (DE); Herbert Knapp, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/861,054

(22) Filed: Sep. 22, 2015

(65) Prior Publication Data

US 2016/0099680 A1    Apr. 7, 2016

(30) Foreign Application Priority Data

Oct. 2, 2014   (DE) .................. 10 2014 220 038

(51) Int. Cl.
*H03B 5/12* (2006.01)
*H01P 3/08* (2006.01)

(52) U.S. Cl.
CPC .......... *H03B 5/1256* (2013.01); *H01P 3/081* (2013.01); *H03B 5/12* (2013.01); *H03B 5/1243* (2013.01); *H03B 5/1259* (2013.01)

(58) Field of Classification Search
CPC .................................................. H03B 5/1256
USPC ..................... 331/36 L, 117 R, 167
See application file for complete search history.

(56) References Cited

U.S. PATENT DOCUMENTS

| | | | |
|---|---|---|---|
| 6,404,304 B1* | 6/2002 | Kwon | H01P 1/20327 333/202 |
| 7,061,340 B2* | 6/2006 | Boccuzzi | H03B 5/1228 331/117 FE |
| 8,994,463 B2* | 3/2015 | Yi | H03B 5/1847 331/107 SL |
| 2011/0267147 A1* | 11/2011 | Trotta | H03B 5/1847 331/108 R |
| 2014/0085012 A1* | 3/2014 | Wu | H03B 1/00 331/8 |

FOREIGN PATENT DOCUMENTS

WO         98/52277 A1    11/1998

* cited by examiner

*Primary Examiner* — Jeffrey Shin
(74) *Attorney, Agent, or Firm* — Eschweiler & Associates, LLC

(57) ABSTRACT

The disclosure provides an oscillator circuit for a voltage controlled oscillator. The oscillator circuit includes first and second coupled transmission lines, wherein the oscillator circuit is configured to provide a variable load impedance at a first end of a signal line of the first transmission line such that a variable inductance is provided between first and second ends of a signal line of the second transmission line in dependence on the variable load impedance. The oscillator circuit is configured to adjust the variable inductance provided between the first and second ends of the signal line of the second transmission line by adjusting the variable load impedance provided at the first end of the signal line of the first transmission line, wherein the variable inductance provided between the first and second ends of the signal line of the second transmission line constitutes a frequency determining element of the oscillator circuit.

11 Claims, 8 Drawing Sheets

OSCILLATOR CIRCUIT

REFERENCE TO RELATED APPLICATION

This application claims priority to German Application number 10 2014 220 038.5 filed on Oct. 2, 2014, the contents of which are incorporated by reference in their entirety.

FIELD

Embodiments of the present disclosure relate to an oscillator circuit for a voltage controlled oscillator. Some embodiments relate to a voltage controlled oscillator comprising the oscillator circuit and to a method for operating the oscillator circuit. Some embodiments relate to an electrically variable inductance for large VCO frequency tuning range (VCO=voltage controlled oscillator).

BACKGROUND

For next generation automotive radar applications (e.g., 77 GHz long-range radar and 79 GHz short-range radar applications) and very high data rate communications about a 5 GHz VCO tuning range over a temperature operation range of −40 to 125° C. is required. An additional 3.5 GHz should be added in the VCO designs to compensate the VCO frequency temperature drift and also to assure a high production yield. Therefore the VCO should have a total electrically tuning range of about 8.5 GHz with also fulfilling the very challenging phase noise request. Moreover, a VCO tuning voltage range of 0.3 to 2.8 V is required due to the low cost request by using only one 3.3 V supply voltage.

Actual VCO architectures cannot meet this 5 GHz tuning range over complete temperature range with the required phase noise specification. Some work-around is under discussion or investigation. An idea is to have two or even more VCO designs in one chip. However, this idea will require more chip area and also needs a complex algorithm to choose one of the different VCO operations during system running. Another idea is to use a switchable capacitance to select the VCO frequency bands. However, this idea will degrade the VCO continuous tuning range (maybe not be able to meet the large electrical tuning range request for short range radar application) and will also degrade the VCO phase noise.

SUMMARY

Embodiments of the present disclosure provide an oscillator circuit for a voltage controlled oscillator. The oscillator circuit comprises first and second coupled transmission lines, wherein the oscillator circuit is configured to provide a variable load impedance at a first end of a signal line of the first transmission line such that a variable inductance is provided between first and second ends of a signal line of the second transmission line in dependence on the variable load impedance. The oscillator circuit is configured to adjust the variable inductance provided between the first and second ends of the signal line of the second transmission line by adjusting the variable load impedance provided at the first end of the signal line of the first transmission line, wherein the variable inductance provided between the first and second ends of the signal line of the second transmission line constitutes a frequency determining element of the oscillator circuit.

Further embodiments provide a voltage controlled oscillator comprising an oscillator circuit comprising first and second coupled transmission lines. The oscillator circuit is configured to provide a variable load impedance at a first end of a signal line of the first transmission line such that a variable inductance is provided between first and second ends of a signal line of the second transmission line in dependence on the variable load impedance. The oscillator circuit is configured to adjust the variable inductance provided between the first and second ends of the signal line of the second transmission line by adjusting the variable load impedance provided at the first end of the signal line of the first transmission line, wherein the variable inductance provided between the first and second ends of the signal line of the second transmission line constitutes a frequency determining element of the oscillator circuit.

Further embodiments provide a method for operating an oscillator circuit for a voltage controlled oscillator, wherein the oscillator circuit comprises first and second coupled transmission lines. The method comprises providing a variable load impedance at a first end of a signal line of the first transmission line such that a variable inductance is provided between first and second ends of a signal line of the second transmission line in dependence on the variable load impedance. The method further comprises adjusting the variable inductance provided between the first and second ends of the signal line of the second transmission line by adjusting the variable load impedance provided at the first end of the signal line of the first transmission line, wherein the variable inductance provided between the first and second ends of the signal line of the second transmission line constitutes a frequency determining element of the oscillator circuit.

BRIEF DESCRIPTION OF THE DRAWINGS

Embodiments of the present disclosure are described herein making reference to the appended drawings.

Figure 1:
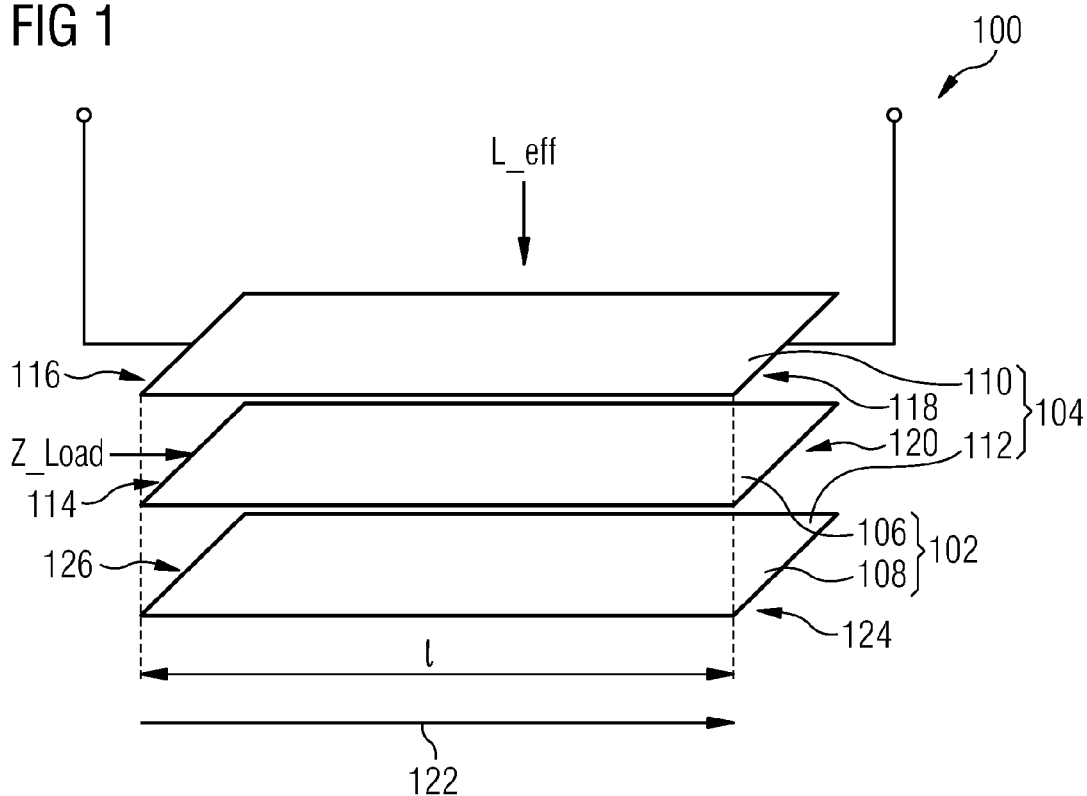
FIG. 1 shows an illustrative view of an oscillator circuit for a voltage controlled oscillator, according to an embodiment.

Equal or equivalent elements or elements with equal or equivalent functionality are denoted in the following description by equal or equivalent reference numerals.

DETAILED DESCRIPTION

FIG. 1 shows an illustrative view of an oscillator circuit 100 for a voltage controlled oscillator. The oscillator circuit 100 comprises first and second coupled transmission lines 102 and 104.

First and second coupled transmission lines 102 and 104 can each comprise a signal line and a ground line. In detail, the first transmission line 102 can comprise a signal line 106 and a ground line 108, wherein the second transmission line 104 can comprise a signal line 110 and a ground line 112. Further, in some embodiments, first and second coupled transmission lines 102 and 104 can comprise a common ground line 108,112, as exemplarily shown in FIG. 1.

The oscillator circuit 100 can be configured to provide a variable load impedance Z_load at a first end 114 of the signal line 106 of the first transmission line 102 such that a variable inductance L_eff is provided between first and second ends 116 and 118 of the signal line 110 of the second transmission line 104 in dependence on the variable load impedance Z_load. Further, the oscillator circuit 100 can be configured to adjust the variable inductance L_eff provided between the first and second ends 116 and 118 of the signal line 110 of the second transmission line 104 by adjusting the variable load impedance Z_load provided at the first end 114 of the signal line 106 of the first transmission line 102.

For example, the oscillator circuit 100 can comprises a variable load impedance element configured to provide the variable load impedance Z_load to the first end 114 of the signal line 106 of the first transmission line 102. The variable load impedance element can be connected in series between the first end 114 of the signal line 106 of the first transmission line 102 and a first end 126 of a ground line 108 of the first transmission line 102. The variable load impedance element can comprise, for example, a varactor, a PIN-Diode or a MOS-device in order to adjust the variable load impedance Z-load of the variable load impedance element in order to adjust the variable inductance L_eff provided between the first and second ends 116 and 118 of the signal line 110 of the second transmission line 104.

The variable inductance L_eff provided between the first and second ends 116 and 118 of the signal line 110 of the second transmission line 104 constitutes a frequency determining element of the oscillator circuit 100. Or in other words, an oscillator frequency of the oscillator circuit depends on the variable inductance L_eff provided between the first and second ends 116 and 118 of the signal line 110 of the second transmission line 104.

As shown in FIG. 1, the first and second coupled transmission lines 102 and 104 can be arranged parallel to each other and extend along a longitudinal direction 122 (e.g., along a geometric line).

Further, a length of the first and second couple transmission lines 102 and 104 should be less than a quarter-wavelength ($\lambda$/4) to have an inductive behavior, wherein $\lambda$ is a wavelength of a signal propagating along the signal line 106 of the first transmission line 102 or the signal line 110 of the second transmission line 104.

The oscillator circuit 100 can be configured to provide a reference potential to a second end 120 of the signal line 106 of the first transmission line 102. The reference potential can be, for example, a ground potential, a high frequency ground potential or a high frequency clock domain ground potential.

For example, the second end 120 of the signal line 106 of the first transmission line 102 and a second end 124 of the ground line 108 of the first transmission line 102 can be connected to each other.

Figure 2:
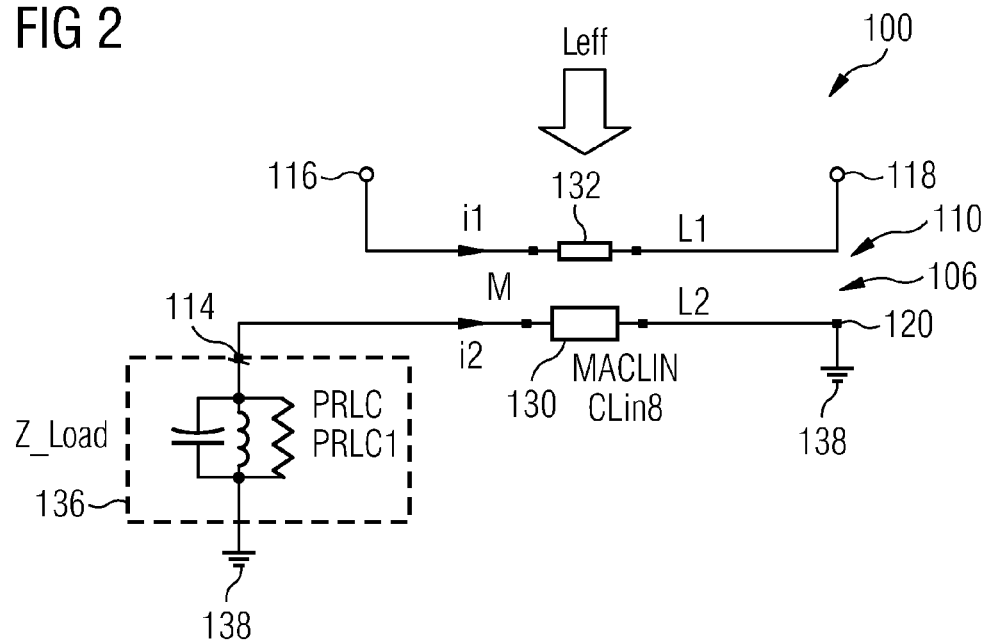
FIG. 2 shows a schematic view of a simulation setup of an oscillator circuit for a voltage controlled oscillator, according to an embodiment.

FIG. 2 shows a schematic view of a simulation setup of an oscillator circuit for a voltage controlled oscillator, according to an embodiment.

In detail, in FIG. 2, the signal lines 106 and 110 of first and second coupled transmission lines 102 and 104 are simulated or modeled by first and second impedance elements 130 and 132. In detail, the signal line 106 of the first transmission line 102 is simulated or modeled by the first impedance element 130, wherein the signal line 110 of the second transmission line 104 is simulated or modeled by the second impedance element 132.

The first impedance element 130 can be connected in series between the nodes 114 and 120 which correspond to the ends 114 and 120 of the signal line 106 of the first transmission line (see FIG. 1). Similarly, the second impedance element 132 can be connected in series between the nodes 116 and 118 which correspond to the ends 116 and 118 of the signal line 110 of the second transmission line 104.

As shown in FIG. 2, the node 114 (which corresponds to the first end 114 of the signal line 106 of the first transmission line 102) is connected to a variable load impedance element 136 configured to provide the variable load impedance Z_load. In detail, the variable load impedance element 136 can be connected in series between the node 114 and a reference potential 138, e.g., a ground potential or a high frequency ground potential. By adjusting the variable load impedance Z_load provided by the variable load impedance element 136 the variable inductance L_eff provided between the nodes 116 and 118 (which correspond to first and second ends 116 and 118 of the signal line 110 of the second transmission line 104) can be adjusted.

Further, the node 120 (which corresponds to the second end 120 of the signal line 106 of the first transmission line 102) can be connected to the reference potential 138, e.g., a ground potential or a high frequency ground potential.

In contrast to the commonly used method of changing a varactor capacitance, according to the concept disclosed herein, an electrically tunable inductance which can also change the VCO oscillation frequency is used. In this way, the VCO performance will not be degraded and also a large chip area is not required.

The variable inductance can be implemented by a tunable load impedance 136 which can be controlled by a controlling voltage. As shown in FIG. 2, the effective inductance L_eff of a coupled transmission line 102 and 104 is also determined by the inductive coupling factor M. If the load impedance Z_load is zero, then the return path current or coupling factor is maximized. If the load impedance Z_load is infinitive, then the return path current will be zero and the coupling factor minimized. In this way, the effective inductance L_eff will be changed with the load impedance Z_load. The variable load impedance Z_load could be implemented by different ways, e.g., a varactor, a PIN-diode or a MOS-device with a controlling voltage.

In general, the oscillating frequency f_osc of a VCO can be determined by f_osc=1/(2*pi*sqrt(L*C)).

In a common VCO, the capacitance C is realized by a varactor and the oscillating frequency f_osc is tuned by varying the varactor capacitance.

In contrast to this, according to the concept disclosed herein, the oscillator circuit 100 comprises first and second coupled transmission lines 102 and 104, wherein the oscillator circuit is configured to adjust the variable inductance L_eff provided between the first and second ends 116 and 118 of the signal line 110 of the second transmission line 104 by adjusting the variable load impedance Z_load provided at the first end 114 of the signal line 106 of the first transmission line 102.

Thereby, L_eff can be determined by L_eff=L1+i2/i1*M, wherein Leff is varied by changing the load impedance of Z_load. As already mentioned, at Z_load=0, the coupling of the two lines is the highest (max. return path current) and the effective inductance L_eff is the smallest. At Z_load=∞, the coupling of the two lines are the lowest (no return path current) and the inductance L_eff is the largest.

The coupling structure can be implemented as coupled transmission line, strip-line or overlapped suspended transmission line. The variable load impedance Z_load can be implemented by any impedance tunable device (e.g., a varactor, a PIN-diode, a heterojunction biploar transistor, or a MOS device).

An advantage of the variable inductance is that the inductance value can be varied linearly with the controlling voltage. In this way, a linear VCO tuning curve can be achieved. Further, the design of a highly linear PLL (phase-locked loop) is made much more easier.

Figure 3:
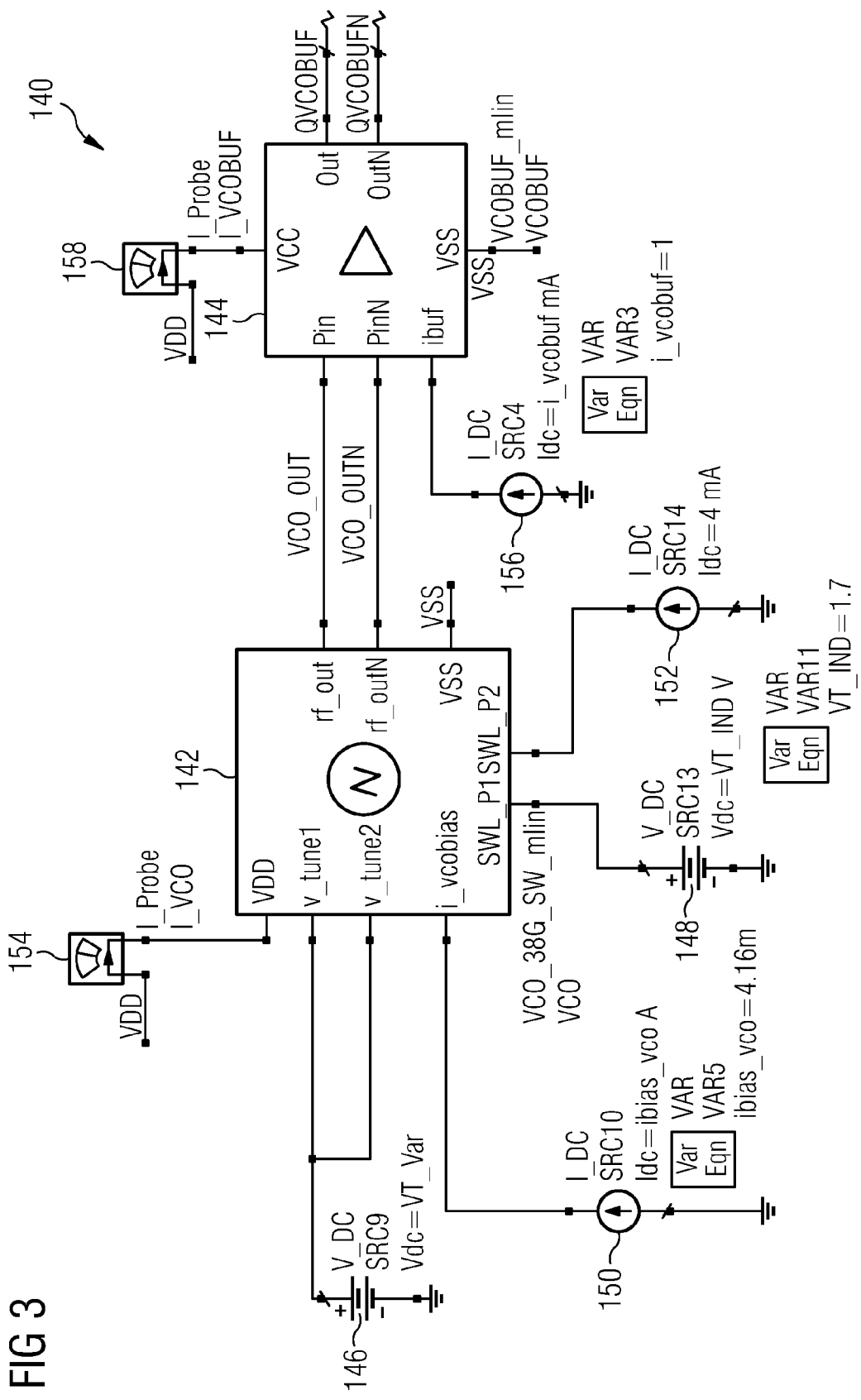
FIG. 3 shows a schematic view of a simulation setup of a voltage controlled oscillator, according to an embodiment.

FIG. 3 shows a schematic view of a simulation setup 140 of a VCO, according to an embodiment. The simulation setup 140 comprises a VCO core 142 and a VCO buffer 144.

The VCO core 142 comprises a positive supply input VDD, a first coarse tuning voltage input v_tune1, a second coarse tuning voltage input v_tune2, a bias current input i_vcobias, a fine tuning voltage input SWL_P1, a current input SWL_P2, a negative supply input VSS, and differential oscillator outputs RF_OUT and RF_OUTN.

Further, the simulation setup 114 comprises a coarse tuning voltage source (VT_Var: VTC) 146 configured to provide a coarse tuning voltage for the first and second coarse tuning voltage inputs v_tune1 and v_tune2 of the VCO core 142, a fine tuning voltage source (VT_IND: VTF) 148 configured to provide a fine tuning voltage for the fine tuning voltage input SWL_P1 of the VCO core 142, a first current source 150 configured to provide a bias current for the bias current input i_vcobias of the VCO core 142, a second current source 152 configured to provide a (constant) current for the current input SWL_P2 of the VCO core 142, and a current sensor 154 configured to sense a current flowing into the supply input VDD of the VCO core 142. The aforementioned elements can be DC (DC=direct current) elements.

The VCO buffer 146 comprises differential inputs Pin and PinN, a buffer current input ibuf, a negative supply input VSS, a positive supply input VCC, differential outputs Out and OutN.

Further, the simulation setup 140 comprises a third current source 156 configured to provide a current for the buffer current input ibuf of the VCO buffer 146, and a current sensor 158 configured to sense a current flowing into the supply input VCC of the VCO buffer 146. The aforementioned elements can be DC (DC=direct current) elements.

Figure 4:
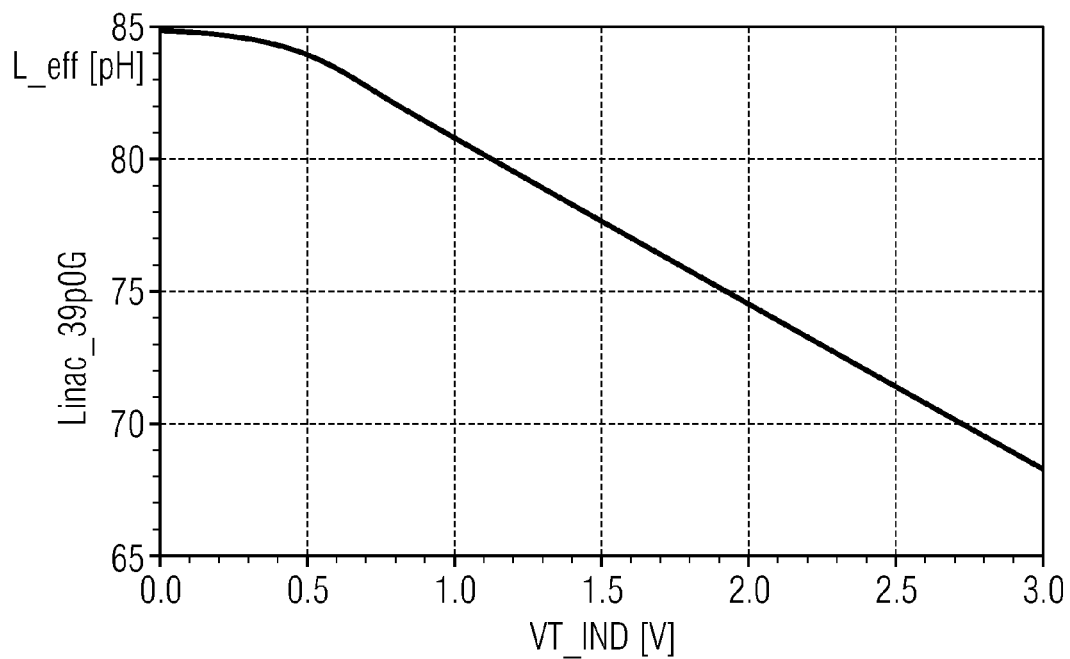
FIG. 4 shows in a diagram simulation results of an inductance provided by first and second coupled transmission lines plotted over a fine tuning voltage.

FIG. 4 shows in a diagram simulation results of an inductance provided between first and second ends 116 and 118 of the signal line 110 of the second transmission line 104 plotted over a fine tuning voltage VT_IND. Thereby, the ordinate denotes the inductance L_eff in pH, wherein the abscissa denotes the fine tuning voltage VT_IND in V.

Thereby, the variable load impedance element was implemented by a varactor with a controlling voltage.

Further, the inductance was changed by about 25% (from 85 pH to 68 pH) by varying the controlling voltage.

As shown in FIG. 4, the curve of the inductance plotted over the fine tuning voltage is high linear.

Figure 5C:
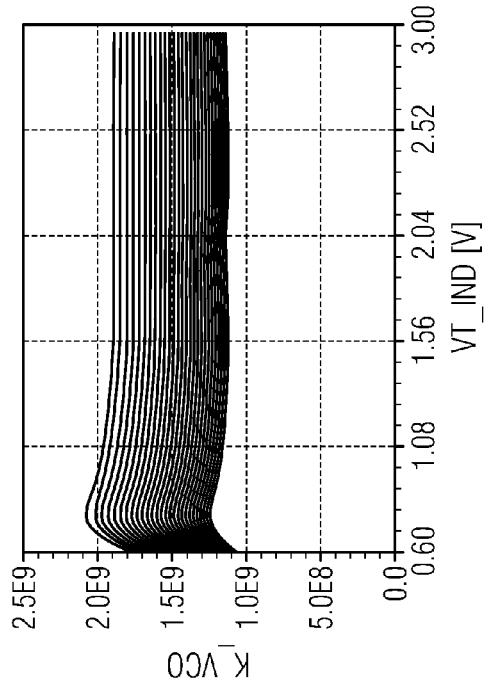
FIG. 5c shows in a diagram simulation results of a sensitivity of the oscillation frequency plotted over the fine tuning voltage for a plurality of different coarse tuning voltages.
Figure 5D:
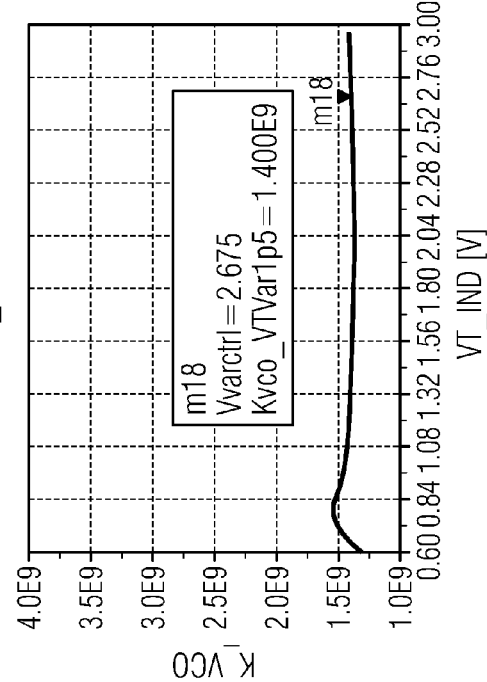
FIG. 5d shows in a diagram simulation results of a sensitivity of the oscillation frequency plotted over the fine tuning voltage for a coarse tuning voltage of 1.5 V.
Figure 5A:
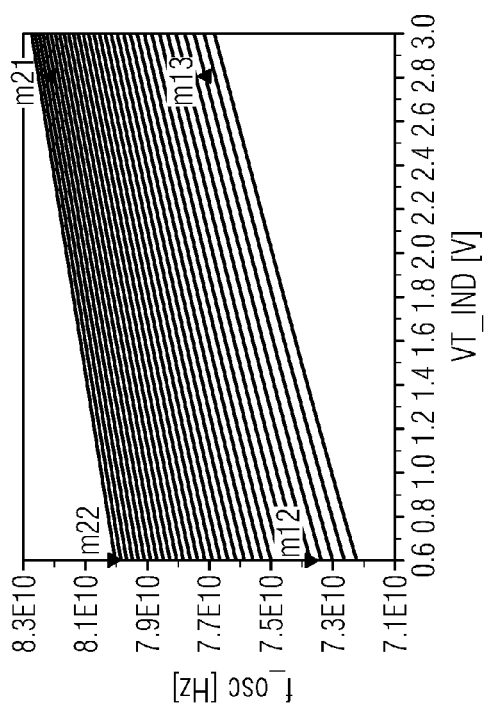
FIG. 5a shows in a diagram simulation results of an oscillator frequency plotted over the fine tuning voltage for a plurality of different coarse tuning voltages.

FIG. 5a shows in a diagram simulation results of an oscillator frequency plotted over the fine tuning voltage for a plurality of different coarse tuning voltages. Thereby, the ordinate denotes the oscillator frequency f_osc in Hz, wherein the abscissa denotes the fine tuning voltage VT_IND in V.

Figure 5B:
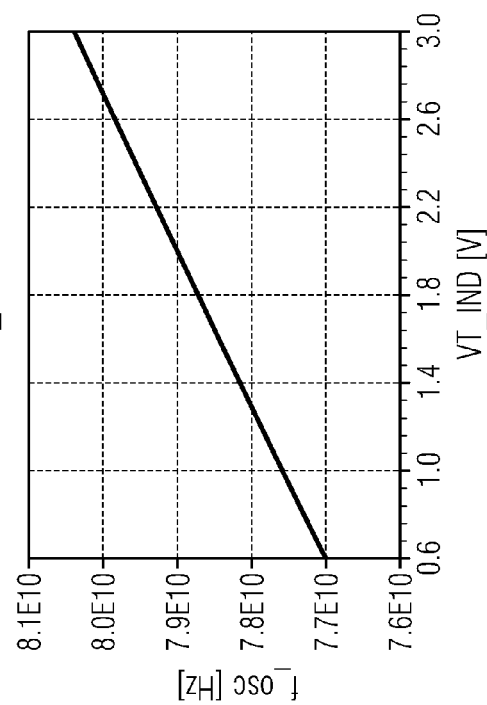
FIG. 5b shows in a diagram simulation results of the oscillator frequency plotted over the fine tuning voltage for a coarse tuning voltage of 1.5 V.

FIG. 5b shows in a diagram simulation results of the oscillator frequency plotted over the fine tuning voltage for a coarse tuning voltage of 1.5 V. Thereby, the ordinate denotes the oscillator frequency f_osc in Hz, wherein the abscissa denotes the fine tuning voltage VT_IND in V.

FIG. 5c shows in a diagram simulation results of a sensitivity of the oscillation frequency K_vco plotted over the fine tuning voltage for a plurality of different coarse tuning voltages. Thereby, the ordinate denotes the sensitivity of the oscillation frequency in Hz/V, wherein the abscissa denotes the fine tuning voltage VT_IND in V.

FIG. 5d shows in a diagram simulation results of a sensitivity of the oscillation frequency K_vco plotted over the fine tuning voltage for a coarse tuning voltage of 1.5 V. Thereby, the ordinate denotes the sensitivity of the oscillation frequency in Hz/V, wherein the abscissa denotes the fine tuning voltage VT_IND in V.

As shown in FIGS. 5a to 5d, the total VCO tuning range is about 9.3 GHz. The sensitivity of the oscillation frequency K_vco for the selected frequency band is almost constant.

Further, as shown in FIGS. 5a to 5d, a further advantage to use this variable inductance is that the achieved oscillation frequency f_osc curve is extremely linear and it makes it much easy to design a highly linear PLL.

Figure 6:
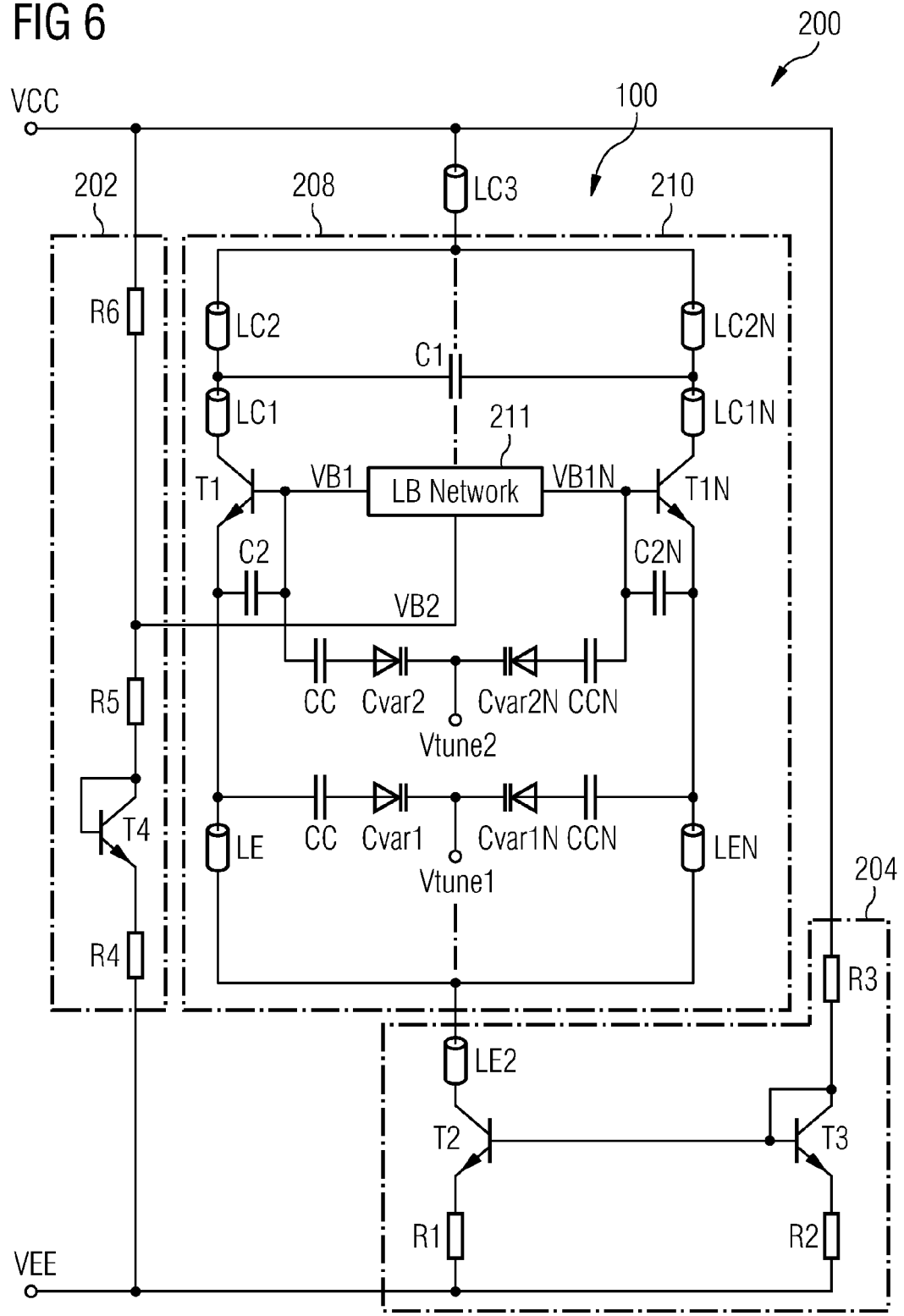
FIG. 6 shows a schematic view of a VCO with an oscillator circuit.

FIG. 6 shows a schematic view of a VCO 200 with an oscillator circuit 100 (Colpitts oscillator).

The VCO 200 comprises a first operating point control circuit unit 202, a second operating point control circuit 204 and a symmetric oscillator circuit 100, having a positive oscillator circuit part 208 and a negative oscillator circuit part 210.

The first operating point control circuit 202 comprises a resistor R6, a resistor R5, a transistor T4 and a resistor R5 connected in series between a positive supply node VCC and a negative supply node VEE.

The second operating point control circuit 204 comprises a resistor R3, a transistor T3 and a resistor R2 connected in series between the positive supply node VCC and the negative supply node VEE. Further, the second operating point control circuit 204 comprises a transmission line LE2, a transistor T2 and a resistor R1 connected in series with the oscillating circuit 100 and a transmission LC3 between the positive supply node VCC and the negative supply node VEE.

The positive oscillator circuit 208 comprises a transmission line LC2, a transmission line LC1, a transistor T1 and a transmission line LE connected in series between the transmission line LC3 and the transmission line LE2 of the second operating point control circuit 204. Further, the positive oscillator circuit 208 comprises a capacitor CC and a varactor Cvar1 connected in series between an emitter of the transistor T1 and a coarse tuning voltage node Vtune1. Further, the positive oscillator circuit 208 comprises a capacitor CC and a varactor Cvar2 connected in parallel between a base of the transistor T1 and a second coarse tuning voltage node Vtune2. Further, the positive oscillator circuit 208 comprises a capacitor C2 connected in parallel between the emitter and the base of the transistor T1. In addition, the base of the transistor T1 is connected to an LB network 211 comprising the first and second coupled transmission lines 102 and 104, described in detail later on with respect to FIG. 7.

The negative oscillator circuit 210 comprises a transmission line LC2N, a transmission line LC1N, a transistor T1N and a transmission line LEN connected in series between the transmission line LC3 and the transmission line LE2 of the second operating point control circuit 204. Further, the negative oscillator circuit 210 comprises a capacitor CCN and a varactor Cvar1N connected in series between an emitter of the transistor T1N and a coarse tuning voltage node Vtune1. Further, the negative oscillator circuit 210 comprises a capacitor CCN and a varactor Cvar2N connected in series between a base of the transistor T1N and the second coarse tuning voltage node Vtune2. Further, the negative oscillator circuit 210 comprises a capacitor C2N connected in series between the emitter and the base of the transistor T1N. In addition, the base of the transistor T1N is connected to an LB network 211 comprising the first and second coupled transmission lines 102 and 104, described in detail later on with respect to FIG. 7.

Figure 7:
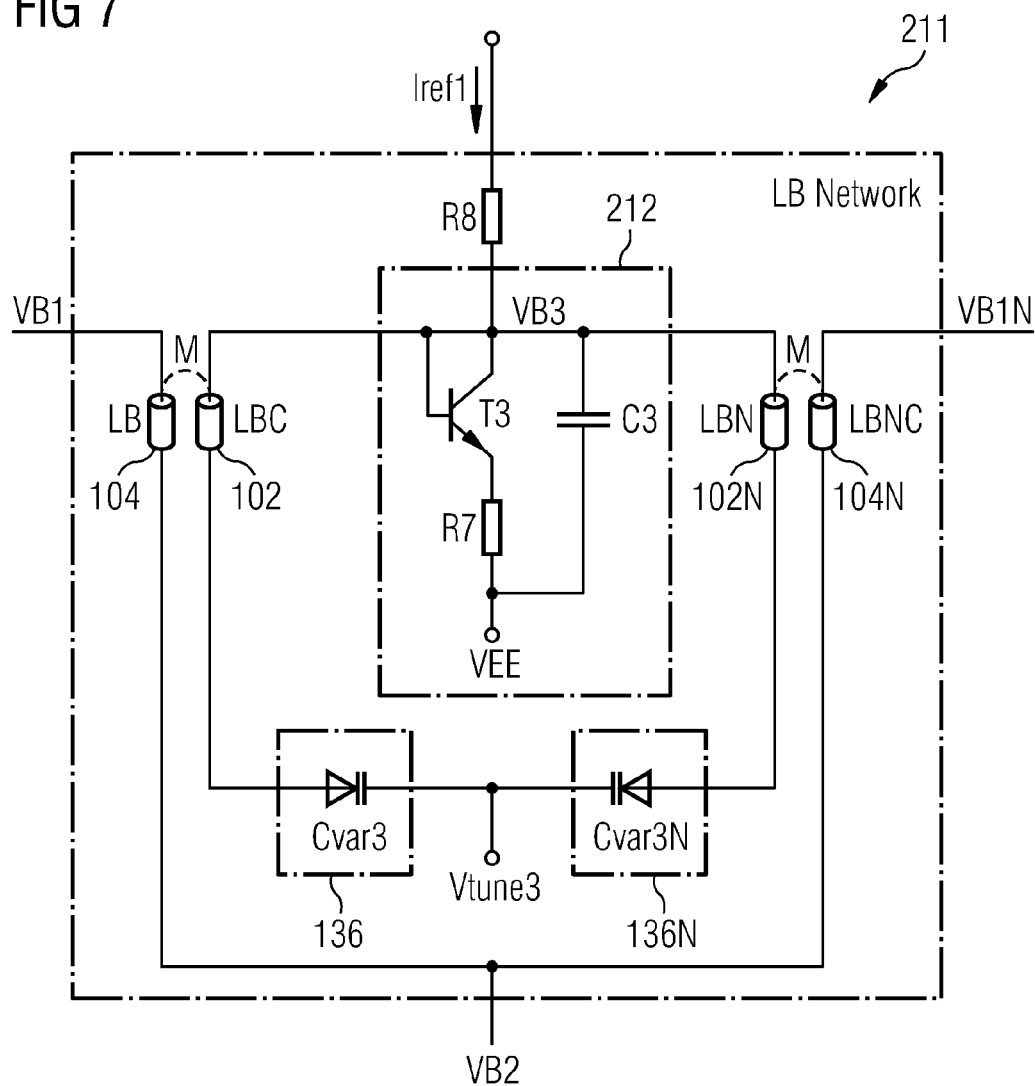
FIG. 7 shows a schematic view of part of the oscillator circuit of the VCO shown in FIG. 6.

FIG. 7 shows a schematic view of the LB network 211 shown in FIG. 6. The LB network 211 comprises first and second coupled transmission lines 102 and 104 (LBC and LB). The second transmission line 104 (LB) is connected in series between the nodes VB1 and VB2 and thus in series between a base of the transistor T1 (see FIG. 6) and a node between the resistors R5 and R6 of the first operating point control circuit 202.

Since the LB network 211 shown in FIG. 7 is symmetrical, the LB network 211 comprises further third and fourth coupled transmission lines 102N and 104N (LBN and LBNC). The fourth transmission line 104N (LBNC) is connected between the nodes VB1N and VB2 and thus in series between the base of the transistor T1N (see FIG. 6) and the node between the resistors R5 and R6 of the first operating point control circuit 202.

Further, the LB network 211 comprises a temperature compensation circuit 212 comprising a transistor T3 and a resistor R7 connected in series between a node VB3 and a negative supply node VEE, and a capacitor C3 also connected in parallel between the node VB3 and the negative supply node VEE. A base of the transistor T3 is also connected to the node VB3. The temperature compensation circuit 212 is biased via a current Iref1 which is supplied to the transistor R8 that is connected to the node VB3.

The LB network 211 further comprises a variable load impedance element 136 and a negative variable load impedance element 136N, wherein the first transmission line 102 (LBC) and the variable load impedance element 136 are connected in series between the node VB3 and the fine tuning voltage node Vtune3, wherein the negative first transmission line 102N (LBN) and the negative variable load impedance element 136N are connected in series between the node VB3 and the fine tuning voltage node Vtune3.

As shown in FIG. 7, a coupled transmission line is used for providing a variable inductance. Thereby, a length of the coupled transmission line is scalable. This provides a flexible design and enables an easy optimizations of the VCO design.

Further, a differential varactor can be used for the impedance variation. This leads to a better quality factor of the implemented inductance. Further, this leads to a reduced sensitivity to common-mode noise from supply and ground.

Further, FIG. 7 shows a special temperature compensation circuit 212 that is biased at another side of the coupled transmission line. With a reference source (Iref1) which has a negative temperature slope the potential at node VB3 will decrease with increasing temperature (larger reverse voltage at varactor Cvar3 and Cvar3N). This will result in smaller inductance (see FIGS. 4 and 5) and then will increase the oscillator frequency f_osc.

The varactors Cvar2 and Cvar2N (see FIG. 6) can be used to further increase the VCO tuning ranges.

Figure 8:
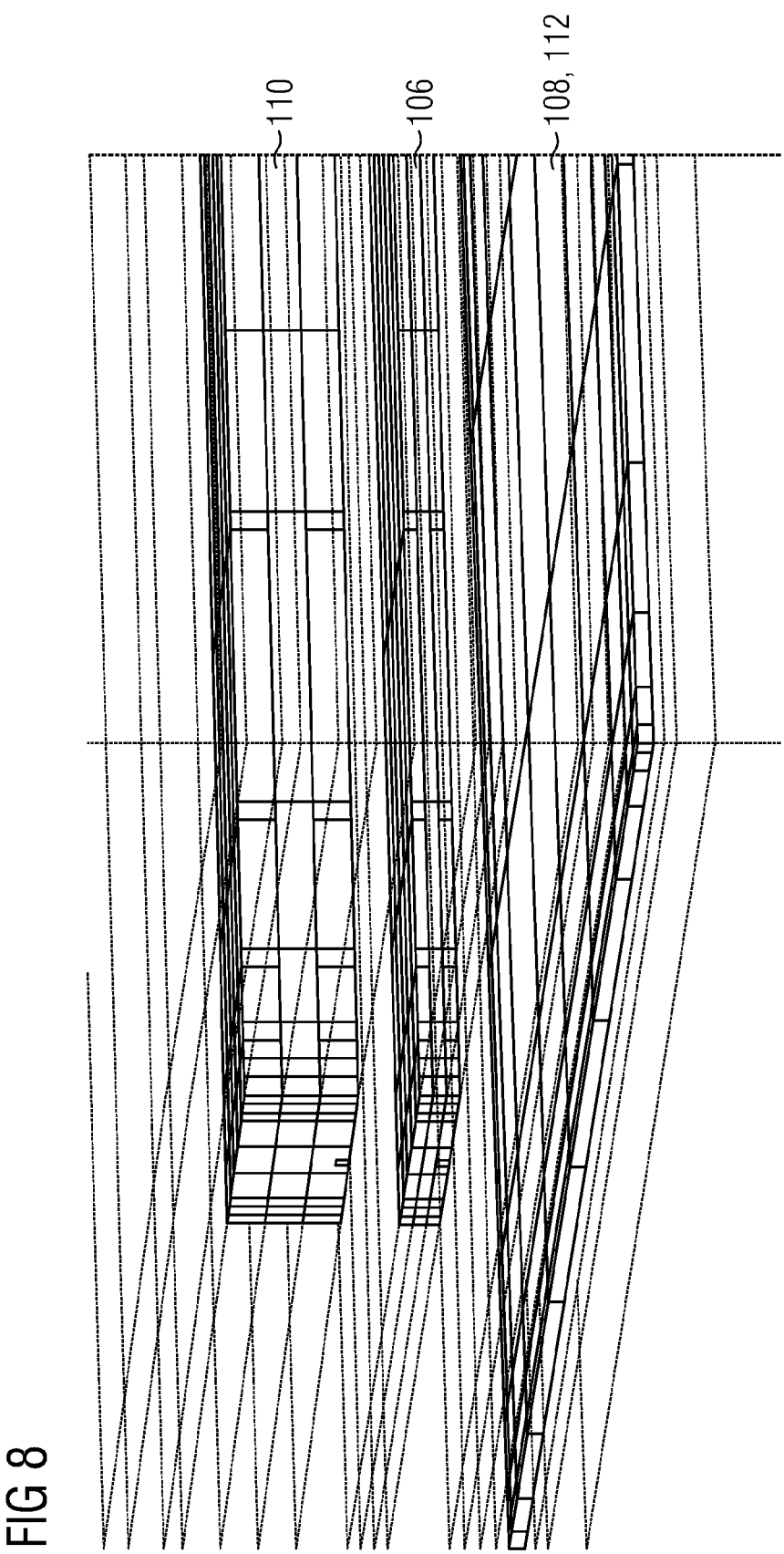
FIG. 8 shows a three-dimensional view of the first and second coupled transmission lines.

FIG. 8 shows a three-dimensional view of the first and second coupled transmission lines 102 and 104. The first transmission line 102 comprises a signal line 106 (TL:LBC) and a ground line 108. The second transmission line 104 comprises a signal line 110 (TL:LB) and a ground line 112. As exemplarily shown in FIG. 8, the first and second coupled transmission lines may comprise a common ground line 108, 112 (GND).

Figure 9:
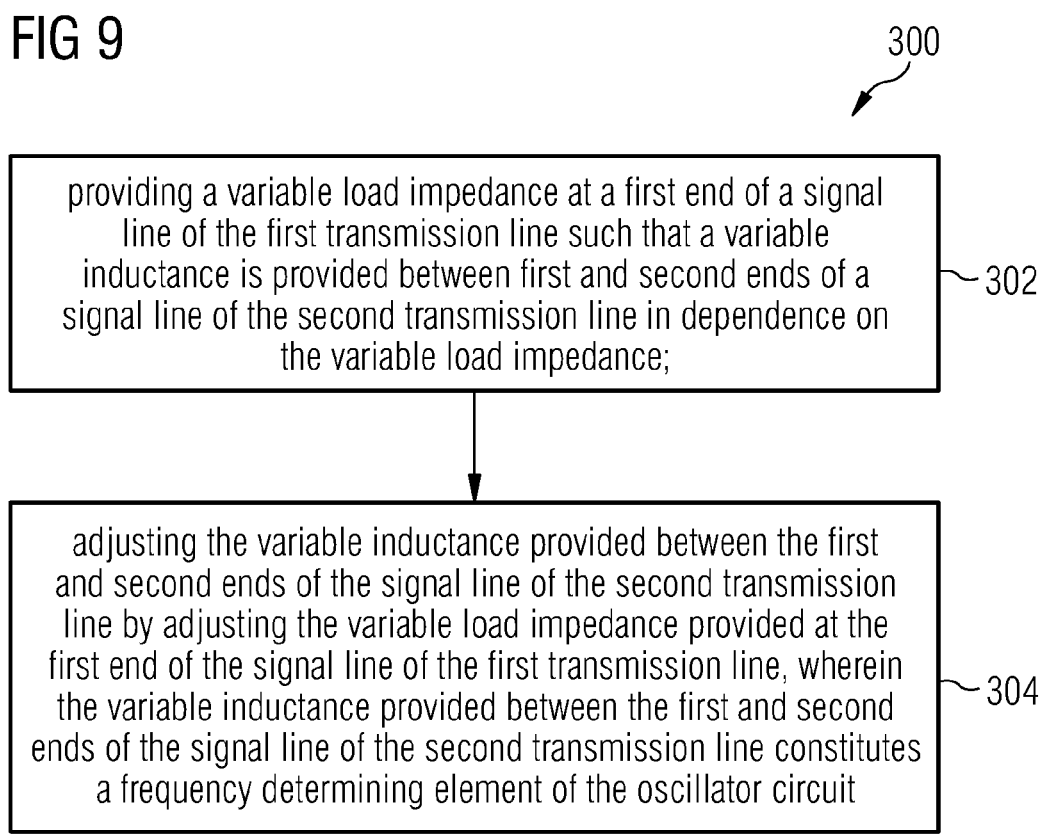
FIG. 9 shows a flowchart of a method for operating an oscillator circuit for a voltage controlled oscillator.

FIG. 9 shows a flowchart of a method 300 for operating an oscillator circuit 100 for a voltage controlled oscillator. The method comprises a step 302 of providing a variable load impedance at a first end of a signal line of the first transmission line such that a variable inductance is provided between first and second ends of a signal line of the second transmission line in dependence on the variable load impedance; and a step 304 of adjusting the variable inductance provided between the first and second ends of the signal line of the second transmission line by adjusting the variable load impedance provided at the first end of the signal line of the first transmission line, wherein the variable inductance provided between the first and second ends of the signal line of the second transmission line constitutes a frequency determining element of the oscillator circuit.

Further embodiments provide a variable inductance which is controlled by a controlling voltage.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An oscillator circuit for a voltage controlled oscillator, wherein the oscillator circuit comprises:
   first and second coupled transmission lines, wherein the oscillator circuit is configured to provide a variable load impedance at a first end of a signal line of the first transmission line such that a variable inductance is provided between first and second ends of a signal line of the second transmission line in dependence on the variable load impedance, wherein the oscillator circuit is configured to adjust the variable inductance provided between the first and second ends of the signal line of the second transmission line by adjusting the variable load impedance provided at the first end of the signal line of the first transmission line, and wherein the variable inductance provided between the first and second ends of the signal line of the second transmission line constitutes a frequency determining element of the oscillator circuit.

2. The oscillator circuit according to claim 1, wherein the first and second coupled transmission lines are arranged parallel to each other and extend along a geometric line.

3. The oscillator circuit according to claim 1, wherein the first and second coupled transmission lines comprise microstrip lines, strip lines or overlapped suspended transmission lines.

4. The oscillator circuit according to claim 1, wherein a length of the first and second coupled transmission lines is less than a quarter-wavelength ($\lambda/4$), wherein $\lambda$ is a wavelength of a signal propagating along the signal line of the first or second transmission line.

5. The oscillator circuit according to claim 1, wherein the first and second coupled transmission lines comprise a common ground line.

6. The oscillator circuit according to claim 1, wherein the oscillator circuit is configured to provide a reference potential to a second end of the signal line of the first transmission line.

7. The oscillator circuit according to claim 1, wherein a second end of the signal line of the first transmission line and a second end of a ground line of the first transmission line are connected to each other.

8. The oscillator circuit according to claim 1, wherein the oscillator circuit comprises a variable load impedance element configured to provide the variable load impedance to the first end of the signal line of the first transmission line.

9. The oscillator circuit according to claim 8, wherein the variable load impedance element is connected in series between the first end of the signal line of the first transmission line and a first end of a ground line of the first transmission line.

10. The oscillator circuit according to claim 8, wherein the variable load impedance element comprises at least one of a varactor, a PIN-Diode and a MOS-device configured to adjust the variable load impedance of the variable load impedance element.

11. A method for operating an oscillator circuit for a voltage controlled oscillator, wherein the oscillator circuit comprises first and second coupled transmission lines, the method comprising:

providing a variable load impedance at a first end of a signal line of the first transmission line such that a variable inductance is provided between first and second ends of a signal line of the second transmission line in dependence on the variable load impedance; and adjusting the variable inductance provided between the first and second ends of the signal line of the second transmission line by adjusting the variable load impedance provided at the first end of the signal line of the first transmission line, wherein the variable inductance provided between the first and second ends of the signal line of the second transmission line constitutes a frequency determining element of the oscillator circuit.

* * * * *